United States Patent
Kim

(10) Patent No.: US 9,337,643 B2
(45) Date of Patent: May 10, 2016

(54) ARC FAULT DETECTOR, ELECTRICAL DEVICE HAVING THE ARC FAULT DETECTOR, AND METHOD OF CONTROLLING THE ELECTRICAL DEVICE

(71) Applicant: SAMSUNG ELECTRONICS CO., LTD., Suwon-si, Gyeonggi-do (KR)

(72) Inventor: Sun Jin Kim, Suwon-si (KR)

(73) Assignee: SAMSUNG ELECTRONICS CO., LTD., Suwon-Si (KR)

( * ) Notice: Subject to any disclaimer, the term of this patent is extended or adjusted under 35 U.S.C. 154(b) by 200 days.

(21) Appl. No.: 14/022,834

(22) Filed: Sep. 10, 2013

(65) Prior Publication Data
US 2014/0071564 A1 Mar. 13, 2014

(30) Foreign Application Priority Data
Sep. 10, 2012 (KR) .................. 10-2012-0100052

(51) Int. Cl.
*H02H 3/00* (2006.01)
*H02H 3/16* (2006.01)
*H02H 1/00* (2006.01)
*G01R 31/14* (2006.01)
*G01R 31/12* (2006.01)
*H02H 7/26* (2006.01)

(52) U.S. Cl.
CPC .............. *H02H 3/16* (2013.01); *G01R 31/14* (2013.01); *H02H 1/0015* (2013.01); *H02H 3/162* (2013.01); *G01R 31/1272* (2013.01); *H02H 7/26* (2013.01)

(58) Field of Classification Search
USPC ........................................................ 361/42
See application file for complete search history.

(56) References Cited

U.S. PATENT DOCUMENTS

| 5,223,795 | A | 6/1993 | Blades |
| 5,835,321 | A * | 11/1998 | Elms et al. ............... 361/45 |
| 2003/0099070 | A1 * | 5/2003 | Macbeth et al. .......... 361/5 |
| 2004/0095695 | A1 | 5/2004 | Kim et al. |

(Continued)

FOREIGN PATENT DOCUMENTS

| EP | 2 387 120 A2 | 11/2011 |
| EP | 2 437 366 A2 | 4/2012 |

OTHER PUBLICATIONS

European Search Report issued Feb. 5, 2014 in the European Patent Office in corresponding European Application No. 13183173.7.

(Continued)

*Primary Examiner* — Stephen W Jackson
*Assistant Examiner* — Ann Hoang
(74) *Attorney, Agent, or Firm* — Staas & Halsey LLP

(57) ABSTRACT

An arc fault detector, an electrical device having the arc fault detector, and a method of controlling the electrical device. The arc fault detector includes a current detector to detect current flowing through a plurality of loads in an electrical device, a filter unit to pass current having a frequency equal to or higher than a predetermined cut-off frequency from the frequency of the detected current, a comparison unit to compare a voltage of the passed current with a predetermined threshold voltage and output a comparison signal based on a comparison result, and a controller to determine whether an arc fault has been generated by comparing the comparison signal with a predetermined reference arc fault signal, determine a load having the arc fault from among the plurality of loads, and control cut-off of power to the determined load.

25 Claims, 9 Drawing Sheets

(56) References Cited

U.S. PATENT DOCUMENTS

2007/0121261 A1 5/2007 Sung
2011/0299201 A1* 12/2011 Rozman et al. ................ 361/42

OTHER PUBLICATIONS

Decision on Grant issued from European Patent Office, Communication under Rule 71(3) EPC dated Dec. 9, 2015 (total 37 pages).

* cited by examiner

ARC FAULT DETECTOR, ELECTRICAL DEVICE HAVING THE ARC FAULT DETECTOR, AND METHOD OF CONTROLLING THE ELECTRICAL DEVICE

CROSS-REFERENCE TO RELATED APPLICATIONS

This application claims the priority benefit of Korean Patent Application No. 10-2012-0100052, filed on Sep. 10, 2012 in the Korean Intellectual Property Office, the disclosure of which is incorporated herein by reference.

BACKGROUND

1. Field

Example embodiments of the present disclosure relate to an arc fault detector to detect an arc fault leading to a fire hazard and a load fault, an electrical device having the arc fault detector, and a method of controlling the electrical device.

2. Description of the Related Art

An arc fault is a phenomenon observed in physically or electrically stressed electrical cords and wires due to wire aging, damaged wiring, worn wiring insulation, or excessive current. However, an arc fault is troublesome in that the arc fault may start a fire or damage an electrical device.

It is now mandatory to use an Arc Fault Circuit Interrupter (AFCI) in the United States. The AFCI is a circuit breaker that detects an arc fault and, upon detection, cuts power to the problematic circuit in an electrical device.

The AFCI, which is installed at an electrical panel, prevents electrical fires by detecting an arc in an electrical wire and cutting power to the electrical wire.

However, such an arc fault detector simply detects an arc fault and halts the distribution of electric power from a power source to the electrical panel, without locating the arc fault (a load having the arc fault).

Previously, even though an arc fault is detected, the arc fault may not be located, which makes it difficult to properly handle the arc fault (e.g. repair the arc fault). That is, upon detection of an arc fault, not a wire having the arc fault but the entire wires connected to the load should be replaced or repaired.

Because the conventional arc fault detector detects an arc fault only when current at or above 5 A flows, it has limitations in detecting an arc fault occurring to a load with a small current capacity in an electrical device.

That is, the conventional arc fault detector only prevents a fire caused by an arc fault in a building power line or a home power line, without preventing damage and a fire of an electrical device caused by an arc fault inside the electrical device.

SUMMARY

Therefore, it is an aspect of the present disclosure to provide an arc fault detector to detect an arc fault inside an electrical device, locate a load having the arc fault, and cut power to the load or a plurality of loads, an electrical device having the arc fault detector, and a method of controlling the electrical device.

Additional aspects of the disclosure will be set forth in part in the description which follows and, in part, will be obvious from the description, or may be learned by practice of the disclosure.

In accordance with an exemplary aspect of the present disclosure, an arc fault detector includes a current detector to detect current flowing through a plurality of loads in an electrical device, a filter unit to pass current having a frequency equal to or higher than a predetermined cut-off frequency from the frequency of the detected current, a comparison unit to compare a voltage of the passed current with a predetermined threshold voltage and output a comparison signal based on a comparison result, and a controller to determine whether an arc fault has been generated by comparing the comparison signal with a predetermined reference arc fault signal, determine a load having the arc fault from among the plurality of loads, and control cut-off of power to the determined load.

The filter unit may include a plurality of High Pass Filters (HPFs) that are connected to the current detector and have different cut-off frequencies, and the comparison unit may include a plurality of comparators that are connected to the plurality of HPFs and have different threshold voltages.

If all of comparison signals received from the plurality of comparators are identical to reference arc fault signals, the controller may determine that parallel arc faults have been generated and control cut-off of power to the plurality of loads.

The arc fault detector may further include a memory to store information about consumption currents corresponding to the cut-off frequencies of the plurality of HPFs and information about a load having each consumption current, and if the controller determines that a comparison signal received from at least one of the plurality of comparators is identical to a reference arc fault signal, the controller may determine a load having a consumption current corresponding to the cut-off frequency of an HPF connected to the at least one comparator and control cut-off of power to the determined load.

If the controller determines that an arc fault has been generated in a plurality of loads, the controller may determine a load having the arc fault by controlling sequential turn-on of the plurality of loads.

The memory may store information about safety of the plurality of loads and the controller may control cut-off of power to the plurality of loads or only cut-off of power to the load having the arc fault based on the safety of the load having the arc fault.

The arc fault detector may further include an output unit to output information about the generation of the arc fault.

The controller may count high signals for a predetermined reference time period, compare the count of the high signals with a predetermined reference number, and determine that an arc fault has been generated, if the count of the high signals is equal to or larger than the predetermined reference number.

When the controller counts the high signals for the predetermined time period, the controller may compare intervals between the high signals with a predetermined reference interval and count only high signals having intervals equal to or higher than the predetermined reference interval.

The reference arc fault signal may have information about at least one of a width, count, and interval of high signals.

In accordance with another aspect of the present disclosure, an electrical device includes a noise filter connected to external power, to filter noise in the external power, and an arc fault detector to detect current flowing through a plurality of loads, filter a frequency equal to or higher than a predetermined cut-off frequency from the frequency of the detected current, output a comparison signal by comparing a voltage corresponding to the filtered frequency with a predetermined threshold voltage, determine whether an arc fault has been generated by comparing the comparison signal with a predetermined reference arc fault signal, and control selective cut-off of power to the plurality of loads, if it is determined that an arc fault has been generated.

The arc fault detector of the electrical device may store information about consumption currents of the plurality of loads and information about cut-off frequencies corresponding to the consumption currents.

The arc fault detector of the electrical device may include a plurality of HPFs that are connected to a current detector and have different cut-off frequencies, a plurality of comparators that are connected to the plurality of HPFs and have different threshold voltages, and a controller to determine a load having a consumption current corresponding to a cut-off frequency of an HPF connected to at least one of the plurality of comparators and control cut-off of power to the determined load, if it is determined that a comparison signal received from the at least one comparator is identical to a reference arc fault signal.

The electrical device may further include a main switch to cut power to the plurality of loads, and if all of comparison signals received from the plurality of comparators are identical to reference arc fault signals, the arc fault detector may determine that parallel arc faults have been generated and control turn-off of the main switch.

In accordance with another aspect of the present disclosure, a method of controlling an electrical device includes comparing a comparison signal with a predetermined reference arc fault signal, when the comparison signal is output from at least one of a plurality of comparators corresponding to frequency bands, determining a cut-off frequency of the comparator that outputs the comparison signal, if it is determined that the comparison signal is identical to the reference arc fault signal, determining a load having a consumption current corresponding to the determined cut-off frequency based on information about consumption currents about a predetermined plurality of loads, cutting power to the determined load, and displaying information indicating the arc fault of the load.

The outputting of the comparison signal from the at least one comparator may include detecting current flowing through the plurality of loads, applying the detected current to a plurality of (HPFs having different cut-off frequencies, comparing a voltage corresponding to current having a frequency equal to or a predetermined cut-off frequency with a predetermined threshold, when the current is output from at least one of the plurality of HPFs, and outputting a comparison signal based on a comparison result.

Different threshold voltages may be predetermined for the comparators connected to the plurality of HPFs.

Reference arc fault signals having different characteristics may be predetermined for cut-off frequencies of the plurality of HPFs.

If all of comparison signals output from the plurality of comparators are identical to reference arc fault signals, the method may further include determining that parallel arc faults have been generated and controlling turn-off of a main switch in the electrical device.

The method may further include determining cut-off frequencies of at least two comparators, if it is determined that comparison signals output from the at least two comparators are identical to reference arc fault signals, determining loads having consumption currents corresponding to the determined cut-off frequencies based on information about consumption currents of the plurality of loads, and determining a load having the arc fault by sequentially turning on the determined loads in descending order of consumption currents.

The method may further include determining whether a plurality of loads have consumption currents corresponding to the determined cut-off frequency, and determining a load in which the reference arc fault signal is generated by sequentially turning on the plurality loads, if it is determined that the a plurality of loads have the consumption currents corresponding to the determined cut-off frequency.

The method may further include checking driving safety of the determined load, and controlling cut-off of power to the plurality of loads, if it is determined based on the driving safety of the determined load that when the determined load is deactivated, function execution is impossible in the electrical device.

The comparison of the comparison signal with the predetermined reference arc fault signal includes counting high signals of the comparison signal for a predetermined reference time, comparing the count with a predetermined reference number, and determining that an arc fault has been generated, if the count is equal to or higher than the reference number.

The counting of the high signals for the predetermined reference time includes comparing intervals between the high signals with a predetermined reference interval, and counting only high signals having intervals equal to or higher than the reference interval.

In accordance with another aspect of the present disclosure, there is provided a system to detect an arc fault, including: an AC power source to commonly provide power to a plurality of electrical devices; each electrical device of the plurality of electrical devices comprising: a noise filter to filter noise included in a common AC power signal; and an arc fault detector to determine whether the arc fault has been generated in at least one load connected to the output of the arc fault detector.

BRIEF DESCRIPTION OF THE DRAWINGS

These and/or other aspects of the disclosure will become apparent and more readily appreciated from the following description of the embodiments, taken in conjunction with the accompanying drawings of which.

DETAILED DESCRIPTION

Figure 1:
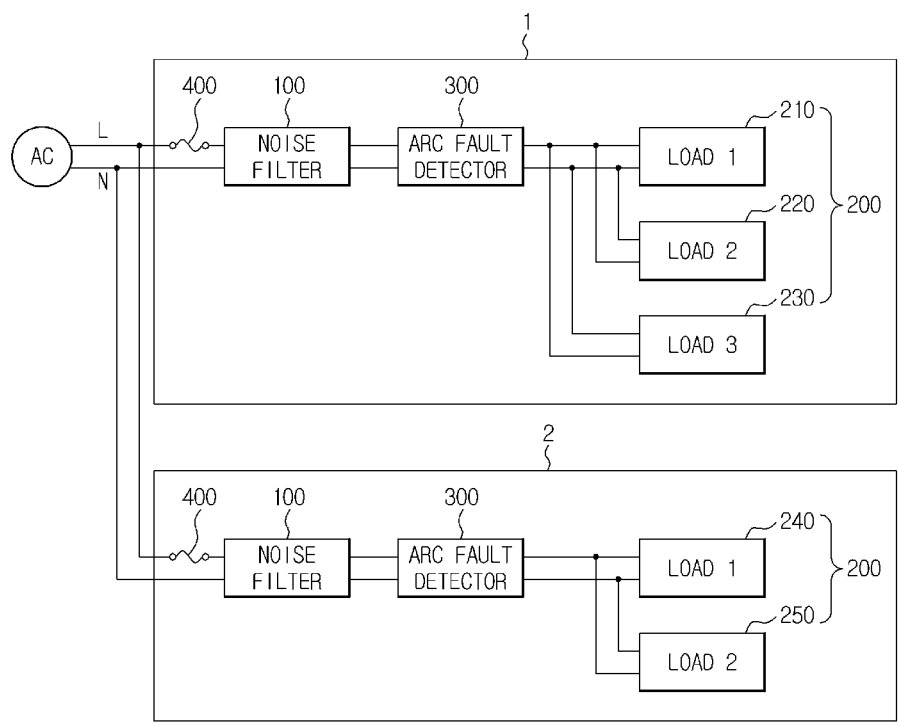
FIG. 1 illustrates the configurations of a plurality of electrical devices, according to an example embodiment of the present disclosure.

Reference will now be made in detail to the embodiments of the present disclosure, examples of which are illustrated in the accompanying drawings, wherein like reference numerals refer to like elements throughout.

FIG. 1 illustrates the configurations of a plurality of electrical devices, according to an example embodiment of the present disclosure. A plurality of electrical devices 1 and 2 may receive external common AC power through power lines L and N to operate and perform predetermined unique functions using the received power.

Each of the electrical devices 1 and 2 may include a noise filter 100 to eliminate noise in the external common AC power, a plurality of loads 200 to receive the noise-free AC power and perform predetermined functions, an arc fault detector 300 to detect an arc fault in the plurality of loads 200, and a main switch 400 to cut the external AC power to a load 200, upon detection of an arc fault in the load 200.

Specifically, the noise filter 100 may be an Electro-Magnetic Interference (EMI) filter which is connected to the external AC power, may eliminate conducted noise introduced from the external AC power, and may supply the AC power free of the conducted noise to the plurality of loads 200 and the arc fault detector 300.

The plurality of electrical devices 1 and 2 connected to the common AC power may include various electrical circuits. These electrical circuits may cause electromagnetic-wave noise due to electrical or magnetic interaction. The noise may be induced into other electrical devices along power lines L and N of the external AC power.

That is, an electrical circuit of an electrical device may be affected by noise in a noise environment and may transfer the noise to another part of an electrical circuit or electrical device. Besides, electromagnetic waves may be created at any place where charges move. When the electromagnetic waves affect other circuits, these electromagnetic waves are a significant cause of noise.

To eliminate the noise, an EMI filter may be used as the noise filter 100. The use of an EMI filter is an example, and thus, the present disclosure is not limited thereto.

The plurality of loads 200 may include devices or parts, such as a motor, a valve, a heater, a Printed Circuit Board (PCB), a display device, a sound device, etc. and may perform predetermined operations to implement unique functionalities of the electrical device. The plurality of loads 200 may consume necessary power during the operations. That is, the plurality of loads 200 may require consumption currents and voltages at different levels during the operations.

For example, if the first electrical device 1 is an indoor unit of an air conditioner, the loads of the indoor unit of the air conditioner may include an expansion value as a first load 210 (load 1), a motor of an indoor fan as a second load 220 (load 2), and a PCB to control the operation of the indoor fan, as a third load 230 (load 3). If the second electrical device 2 is a heater system, the loads of the heater may include a heater as a first load 240 (load 1) and a PCB to control the operation of the heater, as a second load 250 (load 2).

The plurality of loads 200 may output normal driving signals having different characteristics during normal operations and, upon generation of an arc fault, output arc fault signals having different characteristics. That is, each load of the plurality of loads 200 may output a normal driving signal and arc fault signal having different characteristics.

The plurality of loads 200 output noise signals having different characteristics according to positions at which noise is generated. For example, noise in a common AC power line has a voltage of tens of kilovolts and disappears instantly like static electricity. This noise has the property of impulse noise repeated for a predetermined time period without periodicity.

A load such as a relay or a switch creates noise due to an abrupt change in current during a normal operation. This noise causes high-frequency impulses that vibrate for a few periods. The impulses are characterized in that they last a short time, repeated within a predetermined cycle without periodicity.

A load such as motor creates a large amount of high-frequency noise. The noise exists throughout the operation period of the motor, maintaining a specific pattern.

Although an arc fault signal is initially generated intermittently in a very unstable state, the arc fault signal creates a continuous periodic high frequency with passage of time. The high-frequency arc fault signal is characteristically proportional to the magnitude of the physical energy of the load.

Figure 2:
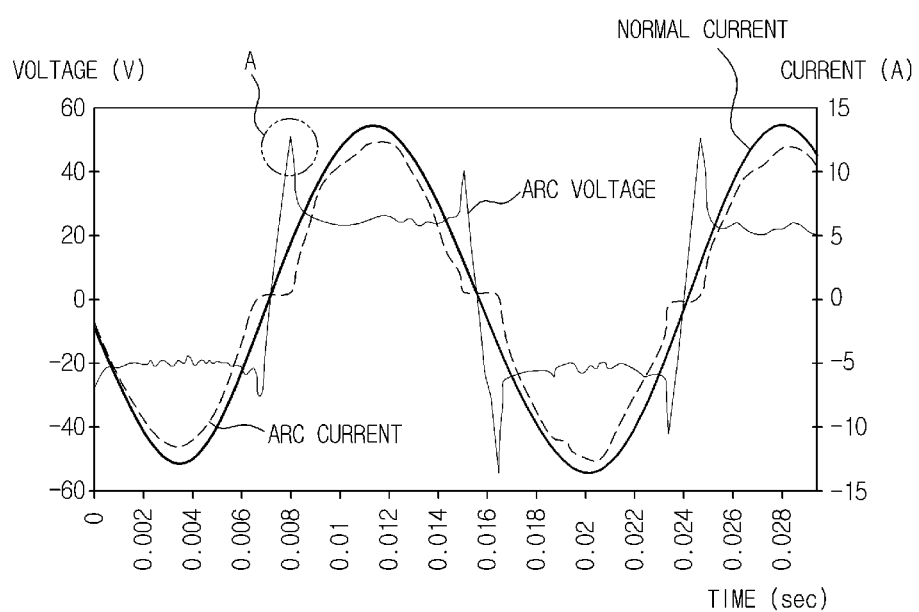
FIG. 2 illustrates exemplary waveforms of an arc current and an arc voltage, when an arc fault occurs to an electrical device, according to an example embodiment of the present disclosure.

Accordingly, an arc fault signal may be detected a predetermined delay time Td after the moment a high signal is first generated, in order to distinguish the arc fault signal from a noise signal generated during an initial operation, as illustrated in FIG. 2. The arc fault signal may be distinguished from the noise signal and a normal driving signal having specific patterns by counting the number of high signals for a predetermined reference time Tr.

Figure 3:
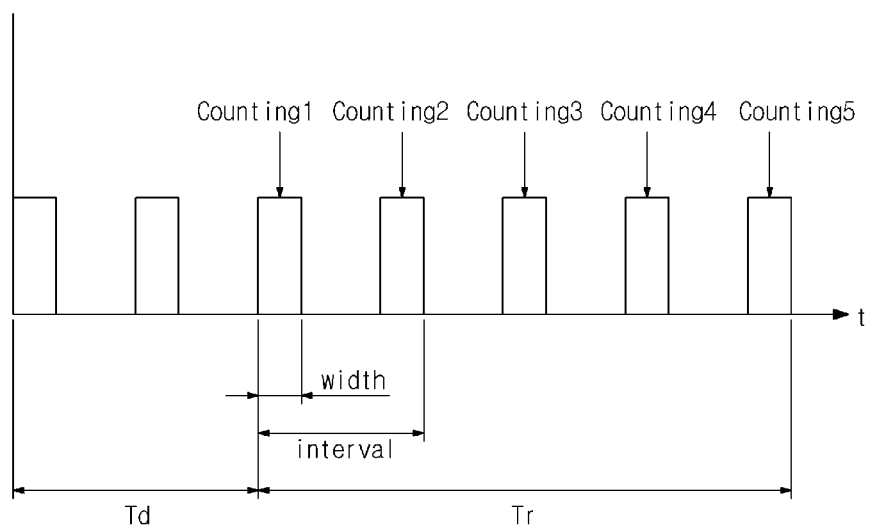
FIG. 3 illustrates an exemplary arc fault signal in the electrical device, according to an example embodiment of the present disclosure.

With reference to FIGS. 2 and 3, generation of an arc fault signal will be described below.

Referring to FIG. 2, in the absence of arcing, alternating current (AC) is represented as a sine wave, whereas upon generation of arcing, the AC is distorted at a phase-changing point, not taking the form of the sine wave. As such, the resulting distorted arc current in turn distorts an arc voltage.

That is, an arc signal may be generated at the moment the phase is changed and it may be predicted that the arc signal has a different interval and a different count according to a frequency.

It may also be predicted that the width of the arc signal depends on the frequency. Thus, as the frequency increases, current and voltage are also increased, thereby increasing the arc voltage and the arc current.

Referring to FIG. 3, the arc fault signal is generated in a different frequency band according to the consumption current of the load. The arc fault signal may have different voltage levels and different widths, intervals, and counts of high signals in different frequency bands. A voltage level may refer to the level of a voltage generated when an arc fault is generated.

The arc fault detector 300 (of FIG. 1) may be connected to the output end of the noise filter 100, which may be an EMI filter, and may receive noise-free AC power from the noise filter 100. Thus, the noise filter 100 may prevent external noise from being induced into the arc fault detector 300 and disturbing arc fault detection.

The arc fault detector 300 may detect current flowing through the plurality of loads 200 of the electrical device based on the AC power received from the noise filter 100. Further, and the arc fault detector 300 may determine whether an arc fault has been generated by dividing the frequency of the detected current into frequency bands.

If determining that an arc fault has been generated, the arc fault detector 300 may identify a load having the arc fault, check the safety of the identified load, and cut power to the identified load or the plurality of loads 200 based on a check result.

Figure 4:
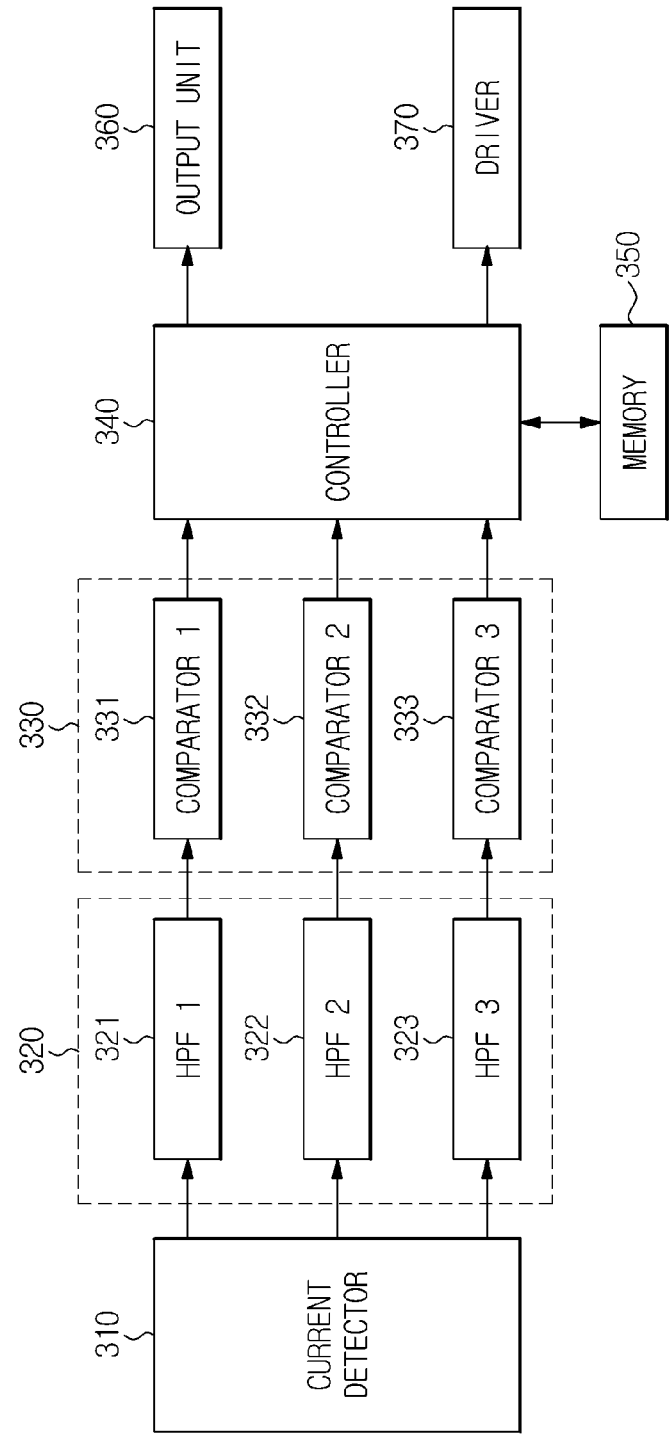
FIG. 4 is a block diagram of an arc fault detector in the electrical device, according to an example embodiment of the present disclosure.

Referring to FIG. 4, in an example embodiment, the arc fault detector 300 may include a current detector 310, a filter unit 320, a comparison unit 330, a controller 340, a memory 350, an output unit 360, and a driver 370.

The current detector 310 may detect current flowing through the plurality of loads in the electrical device. The current detector 310 may include a Current Transformer (CT) which detects a variation of current flowing through the power line L or N according to Faraday's law and outputs a current detection signal representing the current variation.

The current detection signal output from the current detector 310 may be an AC signal having an AC frequency and an AC voltage.

The filter unit 320 may pass the power of a frequency equal to or higher than a predetermined cut-off frequency from the frequency of the current received from the current detector 310. That is, the frequency passed through the filter unit 320 has a voltage corresponding to a current having the passed frequency.

The comparison unit 330 may compare the voltage of the frequency passed through the filter unit 320 with a predetermined threshold voltage and output a comparison signal accordingly. The comparison signal may be a high or low signal.

The filter unit 320 and the comparator 330 may include respectively as many High-Pass Filters (HPFs) as the number of loads and as many comparators as the number of loads in the electrical device, which will be detailed further.

The filter unit 320 may include a plurality of HPFs 321, 322 and 323, which may be connected to the current detector 310 in multiple stages. Each of the HPFs 321, 322 and 323 may receive detected current from the current detector 310 and pass only a frequency equal to or higher than a predetermined cut-off frequency from the frequency of the received current.

The plurality of HPFs 321, 322 and 323 may have different cut-off frequencies and may pass the frequency of current detected by the current detector 310 by dividing the frequency of the detected current into frequency bands corresponding to the cut-off frequencies. A frequency passed through an HPF has a current level and a voltage level corresponding to the current level.

That is, the plurality of HPFs 321, 322 and 323 may output voltages corresponding to frequencies equal to or higher than the predetermined cut-off frequencies.

For example, the first HPF 321 passes a frequency equal to or higher than a first cut-off frequency, the second HPF 322 passes a frequency equal to or higher than a second cut-off frequency, and the third HPF 323 passes a frequency equal to or higher than a third cut-off frequency.

The third cut-off frequency is higher than the second cut-off frequency and the second cut-off frequency is higher than the first cut-off frequency.

Therefore, the third HPF 323 outputs a voltage at a higher level than the second HPF 322 and the second HPF 322 outputs a voltage at a higher level than the first HPF 321. The first HPF 321 outputs a voltage at the lowest level.

The comparison unit 330 includes a plurality of comparators 331, 332 and 333 connected respectively to the HPFs 321, 322 and 323.

The comparators 331, 332 and 333 have arc voltages generated at the cut-off frequencies as threshold voltages.

For example, the first comparator 331 has an arc voltage generated in the first cut-off frequency of the first HPF 321 as a first threshold voltage, the second comparator 332 has an arc voltage generated in the second cut-off frequency of the second HPF 322 as a second threshold voltage, and the third comparator 333 has an arc voltage generated in the third cut-off frequency of the third HPF 323 as a third threshold voltage.

That is, the first threshold voltage is at the lowest level and the third threshold voltage is at the highest level.

Figure 5:
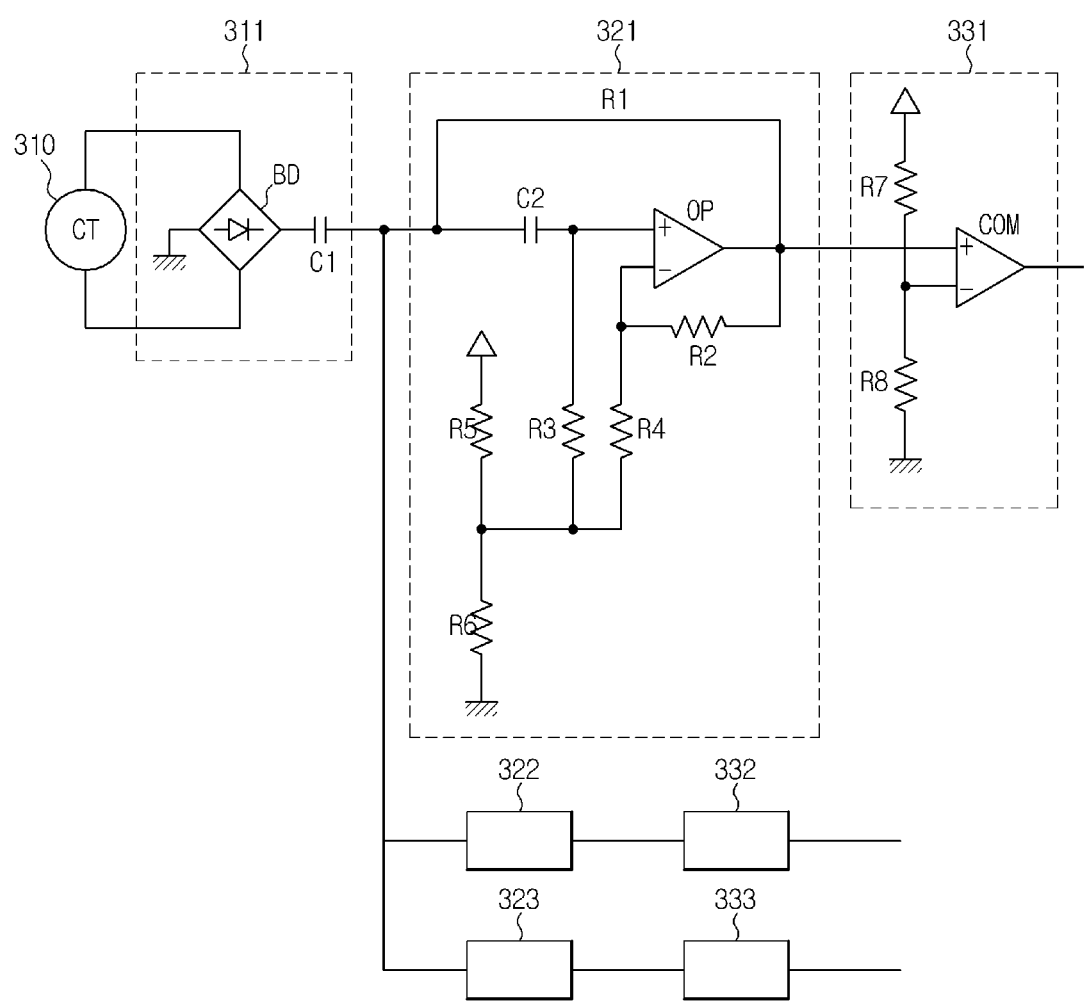
FIG. 5 is a detailed circuit diagram of a filter unit and a comparison unit included in the arc fault detector of the electrical device, according to an example embodiment of the present disclosure.

The circuit configurations of the current detector 310, the filter unit 320, and the comparison unit 330 in the arc fault detector 300 will be described with reference to FIG. 5. The arc fault detector 300 may further include a flattening unit 311.

The flattening unit 311 may include a Bridge Diode (BD) to rectify and flatten current detected by the current detector 310 and a capacitor C1.

The plurality of HPFs 321, 322 and 323 of the filter unit 320 may be connected to the flattening unit 311 and may receive the rectified and flattened current from the flattening unit 311. The rectified and flattened current may have a frequency.

The first HPF 321 is taken as an example from among the HPFs 321, 322 and 323 to describe the configuration of the first HPF 321.

For example, the first HPF 321 includes an amplifier OP AMP, a plurality of resistors R1 to R6 connected to the input and output ends of the amplifier OP, and a capacitor C2.

Specifically, the first HPF 321 may include the following: the second capacitor C2 may be connected between a non-inverting input end of the amplifier OP and a terminal of the first capacitor C1; the first resistor R1 may be connected between the contact point between the first and second capacitors C1 and C2 and the output end of the amplifier OP; the second resistor R2 may be connected between the output end of the amplifier OP and an inverting input end of the amplifier OP; the third resistor R3 may have one end connected to the non-inverting input end of the amplifier OP; the fourth resistor R4 may have an end connected to the inverting input end of the amplifier OP; and the divider resistors R5 and R6 may each have one terminal connected to the other ends of the third and fourth resistors R3 and R4. Herein, the other ends of the third and fourth resistors R3 and R4 are connected to the contact point between the divider resistors R5 and R6.

The values of the resistors R1 to R6 and the value of the second capacitor C2 are determined based on the first cut-off frequency.

In the second and third HPFs 322 and 323, the values of the resistors R1 to R6 and the value of the second capacitor C2 are determined based on the second and third cut-off frequencies.

Each of the plurality of comparators 331, 332 and 333 may be connected to the output end of the amplifier OP of an HPF corresponding to the comparator and may receive a voltage from the amplifier OP.

Among the plurality of comparators 331, 332 and 333, the first comparator 331 will be described as an example.

The first comparator 331 has a non-inverting input end connected to the output end of the amplifier OP of the first HPF 321.

The first comparator 331 may include seventh and eighth divider resistors R7 and R8 connected to an inverting input end of the first comparator 331 and may receive a voltage divided by the seventh and eighth resistors R7 and R8 as the first threshold voltage.

The values of the seventh and eighth resistors R7 and R8 in the first comparator 331 are determined based on the first threshold voltage.

The values of the seventh and eighth resistors R7 and R8 in the second comparator 332 are determined based on the second threshold voltage in the second comparator 332. The values of the seventh and eighth resistors R7 and R8 in the third comparator 333 are determined based on the third threshold voltage in the third comparator 333.

The first comparator 331 outputs a comparison signal by comparing a voltage received from the first HPF 321 with the first threshold voltage, the second comparator 332 outputs a comparison signal by comparing a voltage received from the second HPF 322 with the second threshold voltage, and the third comparator 333 outputs a comparison signal by comparing a voltage received from the third HPF 323 with the third threshold voltage.

The controller 340 (refer to FIG. 4) may compare the comparison signals received from the plurality of comparators 321, 322 and 323 of the comparison unit 330 with a predetermined reference arc fault signal, thereby determining whether an arc fault has been generated.

Specifically, upon receipt of a comparison signal from at least one of the plurality of comparators 331, 322 and 333 corresponding to the respective cut-off frequencies, the controller 340 may compare the received comparison signal with the predetermined reference arc fault signal. If the controller 340 determines that the comparison signal is identical or substantially similar to the reference arc fault signal, the controller 340 may determine the cut-off frequency of the comparator that has output the comparison signal, identify a load having a consumption current corresponding to the determined cut-off frequency based on information about the consumption currents of a predetermined plurality of loads, and control cut-off of power to the identified load and output of an arc fault warning regarding the identified load.

Comparison between the comparison signal output from the at least one comparator with the reference arc fault signal may mean determining the cut-off frequency of the HPF connected to the at least one comparator and comparing the comparison signal with a reference arc fault signal corresponding to the determined cut-off frequency.

If all of comparison signals received from the plurality of comparators 331, 332 and 333 are identical or substantially similar to the reference arc fault signals, the controller 340 may control cut-off of power to the plurality of loads.

It is also possible that the controller 340 may control turn-off of the main switch (e.g. main switch 400) in the electrical device, when the controller 340 determines that parallel arc faults have been generated.

When determining that a comparison signal received from a comparator is identical or substantially similar to a reference arc fault signal, the controller 340 may determine the cut-off frequency of the HPF connected to the comparator and identify a load having a consumption current corresponding to the determined cut-off frequency. If a plurality of loads are identified, the controller 340 sequentially turns on the plurality of loads, and thus detects a load in which the arc fault signal has been generated.

When determining that comparison signals received from two or more comparators are identical to reference arc fault signals, the controller 340 may determine the cut-off frequencies of the HPFs connected to the comparators and identify loads having consumption currents corresponding to the determined cut-off frequencies based on the information about the consumption currents of a predetermined plurality of loads. Then the controller 340 sequentially may turn on the plurality of loads in descending order of consumption currents, and thus detect a load having an arc fault.

The controller 340 may check the driving safety of the load having the arc fault. If determining that when the load having the arc fault is deactivated, function execution is impossible in the electrical device, the controller 340 controls cut-off of power to all of the plurality of loads in the electrical device. On the other hand, if determining that even though the load having the arc fault is deactivated, function execution is possible in the electrical device, the controller 340 controls cut-off of power to the load having the arc fault and does not cut off power to the remaining loads, thereby allowing the electrical device to function.

The controller 340 may count the high signals of a comparison signal within a predetermined reference time period, compare the count with a predetermined threshold number, and if the count is equal to or higher than the predetermined threshold number, determine that an arc fault has been generated.

When counting the high signals of the comparison signal for the predetermined reference time period, the controller 340 may compare the interval between the high signals with a predetermined reference interval and count only high signals spaced from each other by an interval equal to or larger than the predetermined reference interval.

The memory 350 may store the information about consumption currents consumed for operations of loads, the frequencies of the consumption currents, and the safety of the loads and store the reference arc fault signals having different characteristics for the respective cut-off frequencies.

The safety of a load may be information indicating whether when the load is deactivated due to an arc fault, the deactivation of the load adversely affects execution of a unique function of the electrical device.

The output unit 360 may warn the occurrence of an arc fault to a user. The output unit 360 may include at least one of a display unit and an audio unit and output information about a load having the arc fault additionally.

The output unit 360 may visually indicate the type of the arc fault, like serial arc or parallel arcs.

The driver 370 may cut power to at least one load from among the plurality of loads based on a command received from the controller 340.

For example, the driver 370 may drive the main switch (e.g. main switch 400) or a load switch by selectively transmitting an on-signal and an off-signal to the main switch of the electrical device or a switch connected to each load.

Figure 6:
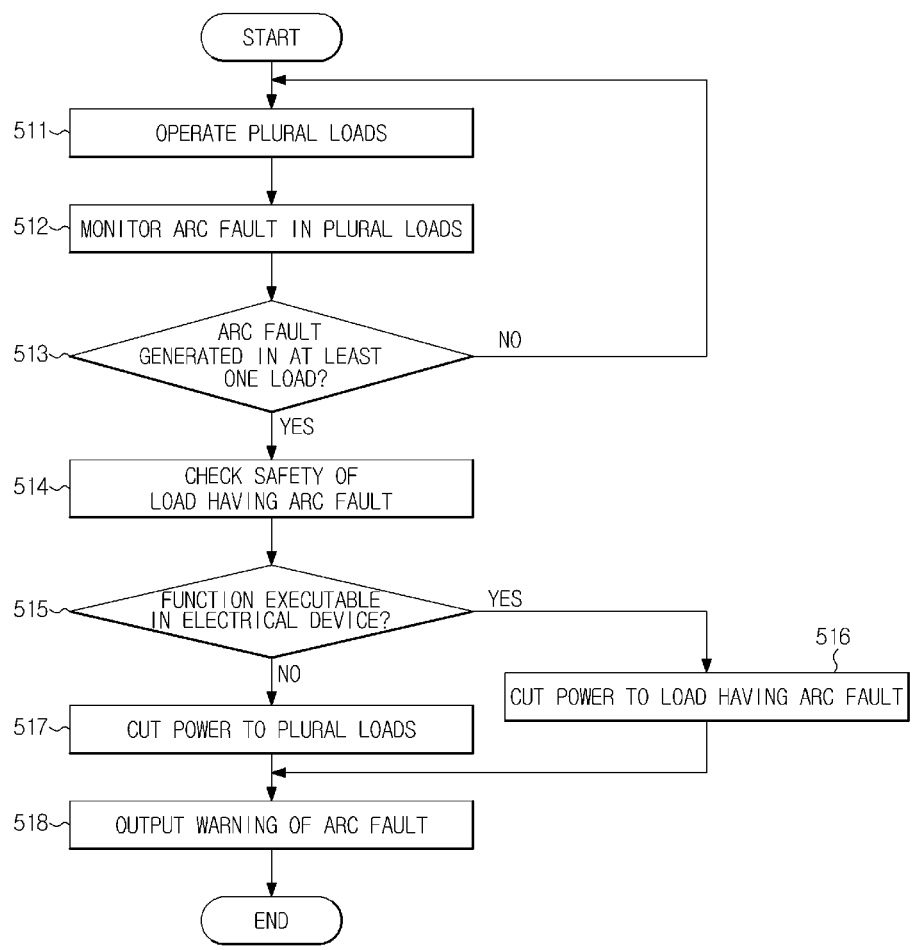
FIG. 6 is a flowchart illustrating an operation to control the electrical device, according to an example embodiment of the present disclosure.

FIG. 6 is a flowchart illustrating a control operation of the electrical device, according to an example embodiment of the present disclosure.

The electrical device receives necessary operation power from external AC power, eliminates noise from the received power, supplies the noise-free power to the plurality of loads, and performs its unique function for operations of the plurality of loads.

While performing the unique function by operating the plurality of loads, as in step 511, the electrical device monitors whether an arc fault has been generated in at least one of the plurality of loads, as in step 512. The arc fault may be detected by the arc fault detector, which will be described later with reference to FIGS. 7 and 8.

Subsequently, the electrical device selectively cuts power to the plurality of loads based on a load driving signal output from the arc fault detector.

Specifically, when determining that an arc fault has been generated in at least one of the plurality of loads, as in step 513, the arc fault detector of the electrical device checks the safety of the load having the arc fault, as in step 514.

The safety of the load is information indicating whether when the load having the arc fault is deactivated, execution of the function of the electrical device is possible or impossible.

If the electrical device determines that function execution is possible in the electrical device despite deactivation of the respective load having the arc fault, as in step 515, the electrical device cuts power only to the load having the arc fault, as in step 516. That is, the load having the arc fault is cut off, however, the remaining loads of the plurality of loads not having the arc fault are not cut off.

On the other hand, if the electrical device determines that function execution is impossible in the electrical device in the case of deactivation of the respective load having the arc fault, as in step 515, the electrical device cuts power to the plurality of loads in the electrical device, as in step 517.

Then the electrical device warns the occurrence of the arc fault by outputting information about the load having the arc fault, as in step 518.

For example, when an arc fault occurs to a water supply valve in a refrigerator, only the water supply valve is deactivated and a warning is output, while the refrigeration and freezing functions of the refrigerator are maintained. In this case, function execution of the refrigerator is possible with power cut off to the water supply valve.

However, if an arc fault occurs to a motor within a compressor in the refrigerator, the whole refrigerator is deactivated and the occurrence of the arc fault is warned, thereby preventing damage to other loads and rapidly coping with the arc fault. In this case, function execution of the refrigerator is impossible with power cut off to the motor within the compressor in the refrigerator.

Figure 7:
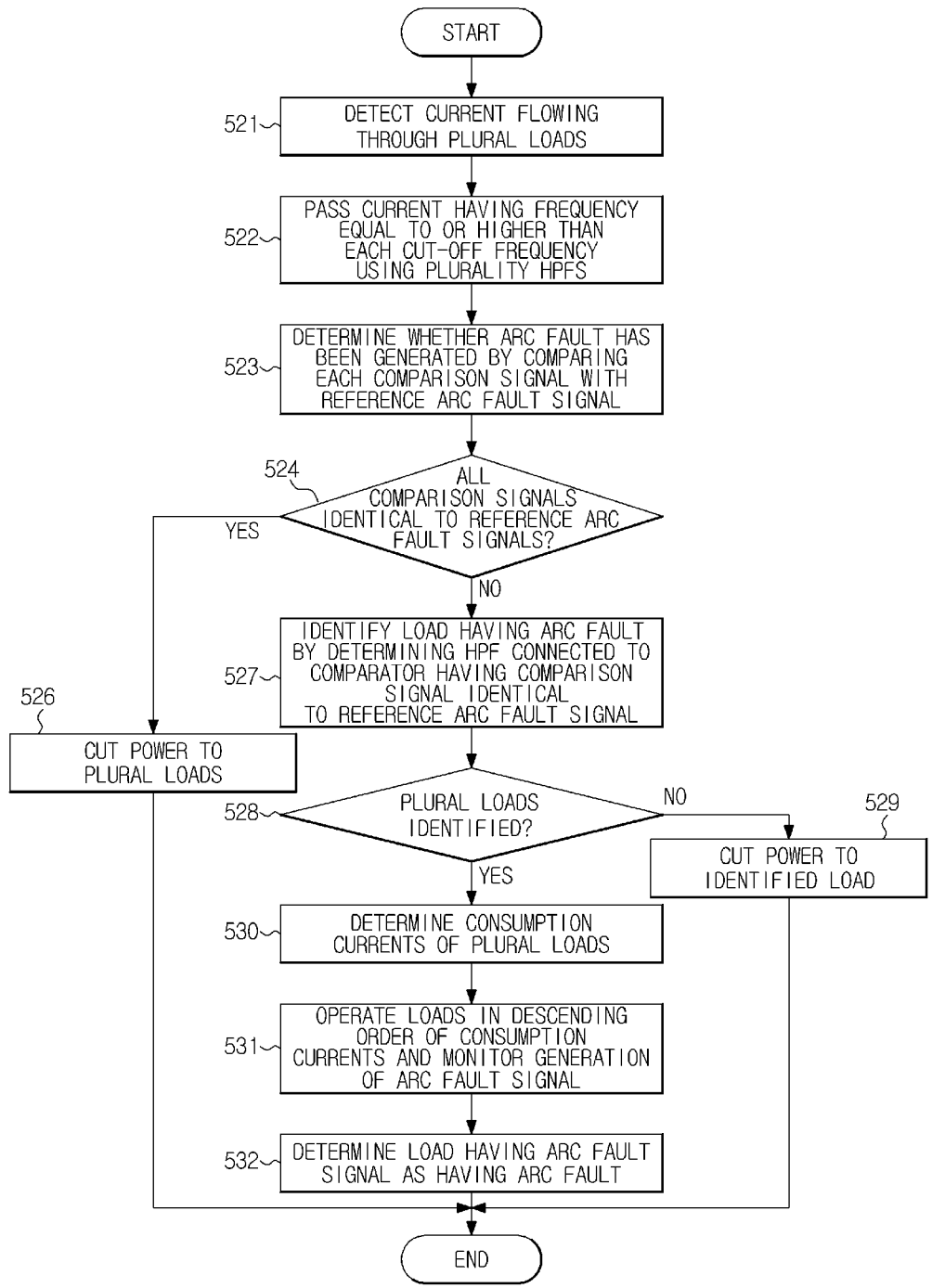
FIG. 7 is a flowchart illustrating an operation to detect an arc fault in the electrical device, according to an example embodiment of the present disclosure.

FIG. 7 is a flowchart illustrating an operation to detect an arc fault according to an example embodiment of the present disclosure. The arc fault detection operation of FIG. 7 will be described, additionally referring to FIG. 8.

Figure 8:
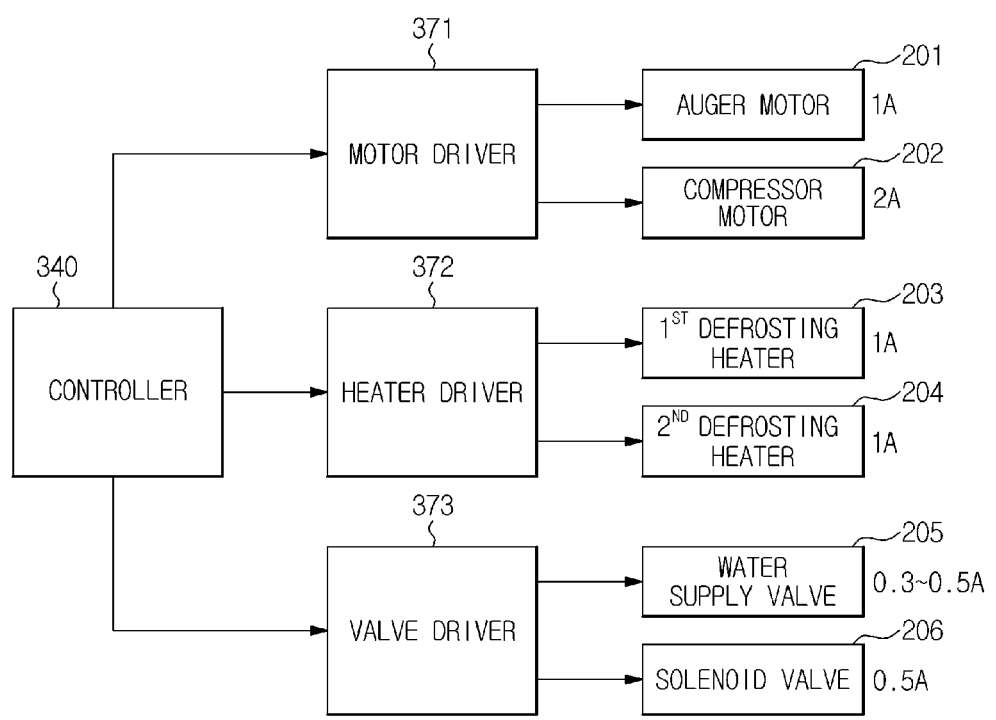
FIG. 8 is a block diagram of a refrigerator as an electrical device, according to an example embodiment of the present disclosure.

FIG. 8 is a block diagram of a refrigerator. The refrigerator includes, as loads, an auger motor 201, a compressor motor 202, a first defrosting heater 203, a second defrosting heater 204, a water supply valve 205, and a solenoid valve 206. The refrigerator further includes a motor driver 371, a heater driver 372, and a valve driver 373 to drive a plurality of motors, a plurality of heaters, and a plurality of valves, respectively. Notably, the refrigerator as the electrical device is an example, and thus, the present disclosure is not limited thereto.

It is assumed that the consumption currents of the auger motor 201, the compressor motor 202, the first and second defrosting heaters 203 and 204, the water supply valve 205, and the solenoid value 206 are respectively about 1 A, about 2 A, about 1 A, about 0.3 to 0.5 A, and about 0.5 A.

The plurality of loads have consumption currents for their operations and have frequencies corresponding to the consumption currents. Cut-off frequencies may be defined on a band basis according to the frequencies of the consumption currents, or threshold voltages may be set according to the respective cut-off frequencies, taking into account arc voltages generated in the respective frequencies.

On the assumption that a consumption current of 0.5 A or below has a frequency ranging from 1.5 to 7 kHz, a consumption current above 0.5 A to 1 A has a frequency ranging from 7 to 15 kHz, and a consumption current above 1 A has a frequency equal to or higher than 15 kHz, the cut-off frequencies of the plurality of HPFs may be set to 1.5, 7, and 15 kHz, respectively. This assumption is an example, and thus, the present disclosure is not limited thereto.

If the arc voltage is 1.5V in the cut-off frequency 1.5 kHz, 2.5V in the cut-off frequency 7 kHz, and 3V in the cut-off frequency 15 kHz, the threshold voltages of the plurality of comparators may be set to 1.5, 2.5 and 3V, respectively.

That is, it is assumed that the first, second, and third cut-off frequencies of the first, second, and third HPFs 321, 322 and 323 are 1.5, 7, and 15 kHz, respectively and the first, second and third threshold voltages of the first, second, and third comparators 331, 332 and 333 are 1.5, 2.5 and 3V, respectively.

Referring again to FIG. 7, when the electrical device operates, the arc fault detector of the electrical device detects current flowing through the plurality of loads, as in step 521, divides the frequency of the detected current into frequency bands, and outputs current in the divided frequency bands to the plurality of HPFs.

Each of the HPFs passes current having a frequency equal to or higher than a predetermined cut-off frequency from the current received from the current detector, as in step 522. The frequency passed through each HPF has a voltage level corresponding to current.

Then the plurality of comparators of the arc fault detector compare the voltages received from the HPFs with the threshold voltages and output comparison signals accordingly to the controller, as in step 523.

The first HPF 321 passes a frequency of 1.5 kHz or above from the frequency of the detected current and the first comparator 331 outputs a voltage of 1.5V or above as a high signal and a voltage below 1.5V as a low signal, from the voltage corresponding to the frequency of 1.5 kHZ or above.

The second HPF 322 passes a frequency of 7 kHz or above from the frequency of the detected current and the second comparator 332 outputs a voltage of 2.5V or above as a high signal and a voltage below 2.5V as a low signal, from the voltage corresponding to the frequency of 7 Khz or above.

The third HPF 323 passes a frequency of 15 kHz or above from the frequency of the detected current and the third comparator 333 outputs a voltage of 3V or above and a voltage below 3V as a low signal, from the voltage corresponding to the frequency of 15 Khz or above as a high signal.

The arc fault detector detects occurrence of an arc fault by comparing the comparison signal received from each comparator with a reference arc fault signal, as in step 524.

The arc fault detector determines whether an arc fault has been generated in loads that may suffer from an arc fault in the first cut-off frequency by comparing the first comparison signal received from the first comparator with the first reference arc fault signal, determines whether an arc fault has been generated in loads that may suffer from an arc fault in the second cut-off frequency by comparing the second comparison signal received from the second comparator with the second reference arc fault signal, and determines whether an arc fault has been generated in loads that may suffer from an arc fault in the third cut-off frequency by comparing the third comparison signal received from the third comparator with the third reference arc fault signal.

Figure 9:
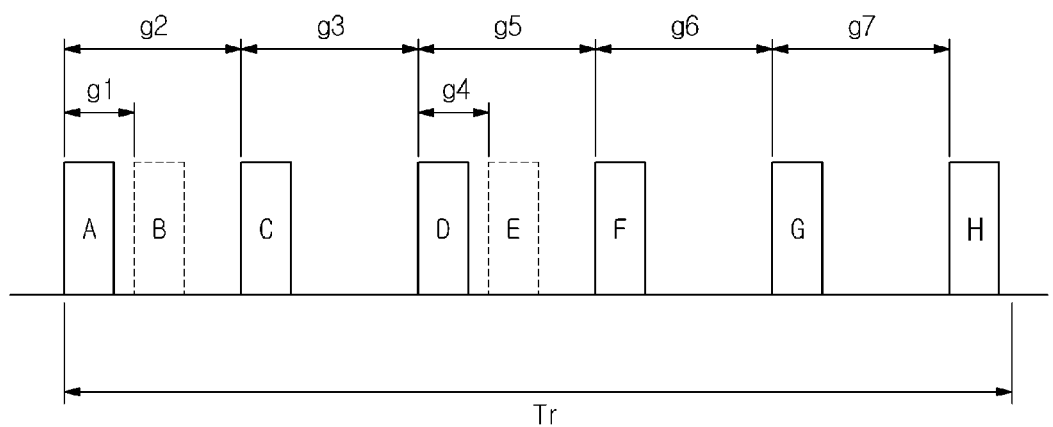
FIG. 9 illustrates an exemplary operation to determine an arc fault signal in the arc fault detector of the electrical device, according to an example embodiment of the present disclosure.

A description will be given of determination of whether a comparison signal is identical or substantially similar to a reference arc fault signal, with reference to FIG. 9.

The arc fault detector counts the number of high signals A to H within the predetermined reference time Tr a predetermined time after reception of a high signal.

The arc fault detector compares the interval between adjacent high signals with a predetermined reference interval. If the interval between adjacent high signals is smaller than the predetermined reference interval, the arc fault detector extracts high signals again, while omitting the latter high signals B and E in the pairs of adjacent high signals because intervals g1 and g4 are smaller than the predetermined reference interval.

That is, the arc fault detector counts only the high signals A, C, D, F, G and H having intervals g2, g3, g5, g6 and g7 equal to or higher than the predetermined reference interval.

The arc fault detector compares the count with a predetermined reference number. If the count is equal to or larger than the predetermined reference number, the arc fault detector determines that an arc fault has been generated.

Then the arc fault detector determines whether all of the comparison signals received from the plurality of comparators are identical or substantially similar to the reference arc fault signals, as in step 524. If all of the comparison signals received from the plurality of comparators are identical or substantially similar to the reference arc fault signals, the arc fault detector cuts power to the plurality of loads, determining that parallel arc faults have been generated, as in step 526. On the other hand, if all of the comparison signals received from the plurality of comparators are not identical to the reference arc fault signals, the arc fault detector determines that a serial arc may have been generated.

The arc fault detector identifies a comparator that has output a comparison signal identical or substantially similar to a reference arc fault signal, determines an HPF connected to the identified comparator, and determines the cut-off frequency of the determined HPF. The arc fault detector identifies a load having an arc fault in the determined cut-off frequency, as in step 527.

That is, the arc fault detector detects a load having the cut-off frequency as an operation frequency and the current of the operation frequency as consumption current.

The arc fault detector determines whether a plurality of loads have been identified, as in step 528. If a plurality of loads have not been identified, the arc fault detector determines that an arc fault has been generated in the single identified load, as in step 529. On the contrary, if a plurality of loads has been identified as loads from which arc fault signals have been generated, the arc fault detector checks the consumption currents of the plurality of loads, as in step 530.

The arc fault detector turns on the plurality of loads sequentially in descending order of consumption currents and determines whether an arc fault signal is generated during the operations of the loads, as in step 531. The arc fault detector determines a load from which an arc fault signal is generated as a load having an arc fault, as in step 532.

Referring again to FIG. 8, for example, if the first, second, and third comparison signals received from the first, second, and third comparators are identical to the first, second, and third reference arc fault signals, respectively, then the arc fault detector of the refrigerator cuts power to all of the loads 201 to 206, determining that parallel arc faults have been generated.

As another example, if the first comparison signal received from the first comparator is identical to the first reference arc fault signal, the second comparison signal received from the second comparator is not identical to the second reference arc fault signal, and the third comparison signal received from the third comparator is not identical to the third reference arc fault signal, then the arc fault detector of the refrigerator determines a load having a consumption current corresponding to the first cut-off frequency of the first HPF connected to the first comparator, determining that a serial arc fault has been generated.

Herein, the arc fault detector determines that at least one of the water supply valve 205 and the solenoid valve 206 having the first cut-off frequency as an operation frequency and currents of the operation frequency as consumption currents is likely to suffer from an arc fault.

The arc fault detector checks the consumption currents of the water supply valve 205 and the solenoid valve 206 and selects a load having the higher consumption current.

For example, the load having the higher consumption current may be the solenoid valve 206. The arc fault detector first operates the solenoid valve 206 and determines whether an arc fault signal is generated during the operation of the solenoid valve 206. If an arc fault signal is not generated during the operation of the solenoid valve 206, the arc fault detector operates the water supply valve 205 and determines whether an arc fault signal is generated during the operation of the water supply valve 205.

Once the arc fault detector detects a valve in which an arc fault signal is generated, it transmits a deactivation signal to deactivate the value having the arc fault to the valve driver 373.

If no arc fault signal is generated in either of the valves, the arc default detector may again compare the first comparison signal received from the first comparator with the first reference arc fault signal.

If the first and second comparison signals received from the first and second comparators are identical to the first and second reference arc fault signals and the third comparison signal received from the third comparator is not identical to the third reference arc fault signal, the arc fault detector of the refrigerator determines that a serial arc fault has been generated.

The arc fault detector detects loads having consumption currents corresponding to the first cut-off frequency of the first HPF connected to the first comparator and loads having consumption currents corresponding to the second cut-off frequency of the second HPF connected to the second comparator.

The arc fault detector determines at least one of the water supply valve 205 and the solenoid valve 206 having the first cut-off frequency as their operation frequency and currents of the operation frequency as consumption currents (e.g. 0.5 A or below) and the auger motor 201, the first defrosting heater 203, and the second defrosting heater 204 having the second cut-off frequency as their operation frequency and currents of the operation frequencies as consumption currents (e.g. 0.5 A to 1 A) is likely to have an arc fault.

The arc fault detector determines the consumption currents of the water supply valve 205, the solenoid valve 206, the auger motor 201, the first defrosting heater 203, and the second defrosting heater 204 and selects a load having the highest consumption current.

The auger motor 201, the first defrosting heater 203, and the second defrosting heater 204 have the highest consumption current. Accordingly, the arc fault detector sets an arbitrary operation order for the auger motor 201, the first defrosting heater 203, and the second defrosting heater 204. The solenoid valve 206 has the second highest consumption current and the water supply valve 205 has the lowest consumption current.

The arc fault detector sequentially operates the plurality of loads in the determined order and determines whether an arc fault signal is generated during the operations of the loads.

If the operation order is the auger motor 201, the first defrosting heater 203, and the second defrosting heater 204, then the arc fault detector first operates the auger motor 201 and determines whether an arc fault signal is generated during the operation of the auger motor 201. Upon generation of an arc fault signal in the auger motor 201, the arc fault detector transmits a deactivation signal to deactivate the auger motor 201 to the motor driver 371.

If an arc fault signal is not generated during the operation of the auger motor 201, the arc fault detector operates the first defrosting heater 203 and determines whether an arc fault signal is generated during the operation of the first defrosting heater 203. Upon generation of an arc fault signal in the first defrosting heater 203, the arc fault detector transmits a deactivation signal to deactivate the first defrosting heater 203 to the heater driver 372.

If an arc fault signal is not generated during the operation of the first defrosting heater 203, the arc fault detector operates the second defrosting heater 204 and determines whether an arc fault signal is generated during the operation of the second defrosting heater 204.

In this manner, it is possible to identify a load having an arc fault from among a plurality of loads.

As is apparent from the above description, upon occurrence of an arc fault in an electrical device such as a refrigerator, a washing machine, an air conditioner, etc., an internal load suffering from the arc fault is accurately identified in the electrical device. Particularly, even arcing in a load having a small consumption current capacity can be sensed accurately.

For example, if an arc fault occurs to a water supply valve in a refrigerator, only the water supply valve is deactivated and a warning is emitted, while the refrigeration and freezing functions of the refrigerator are maintained. Therefore, a necessary safety action can be taken, while food kept in the refrigerator is maintained fresh.

On the other hand, upon generation of an arc fault in a motor of a compressor in the refrigerator, the whole refrigerator is deactivated and a warning is emitted. Therefore, damage to other loads is prevented and a rapid action can be taken against the arc fault.

As a consequence, consumer satisfaction is increased.

Furthermore, as the detection of an arc fault inside the electrical device is warned, a fire can be prevented and a load having the arc fault can be readily repaired.

Although a few embodiments of the present disclosure have been shown and described, it would be appreciated by those skilled in the art that changes may be made in these embodiments without departing from the principles and spirit of the disclosure, the scope of which is defined in the claims and their equivalents.

What is claimed is:

1. An arc fault detector, comprising:
   a current detector to detect current flowing through a plurality of loads;
   a filter unit to pass current having a frequency equal to or higher than a predetermined cut-off frequency from the frequency of the detected current;
   a comparison unit to compare a voltage of the passed current with a predetermined threshold voltage and output a comparison signal based on a result of the comparing; and
   a controller to determine whether an arc fault has been generated by comparing the comparison signal with a predetermined reference arc fault signal, determine a load having the arc fault from among the plurality of loads, and control cut-off of power to the determined load,
   wherein the plurality of loads are in an electrical device;
   wherein the filter unit includes a plurality of High Pass Filters (HPFs) connected to the current detector and that have different cut-off frequencies, and the comparison unit includes a plurality of comparators that are connected to the plurality of HPFs and have different threshold voltages; and
   wherein when all of comparison signals received from the plurality of comparators are identical to reference arc fault signals, the controller determines that parallel arc faults have been generated and controls cut-off of power to the plurality of loads.

2. The arc fault detector according to claim 1, further comprising a memory to store information about consumption currents corresponding to the cut-off frequencies of the plurality of HPFs and information about a load having each consumption current,
   wherein when the controller determines that a comparison signal received from at least one of the plurality of comparators is identical to a reference arc fault signal, the controller identifies a load having a consumption current corresponding to the cut-off frequency of an HPF connected to the at least one comparator and controls cut-off of power to the determined load.

3. The arc fault detector according to claim 2, wherein when the controller determines that an arc fault has been generated in a plurality of loads, the controller identifies a load having the arc fault by controlling sequential turn-on of the plurality of loads.

4. The arc fault detector according to claim 3, wherein the memory stores information about safety of the plurality of loads and the controller controls cut-off of power to the plurality of loads or only cut-off of power to the load having the arc fault based on the safety of the load having the arc fault.

5. The arc fault detector according to claim 1, further comprising an output unit to output information about the generation of the arc fault.

6. The arc fault detector according to claim 1, wherein the controller counts high signals for a predetermined reference time period, compares the count of the high signals with a predetermined reference number, and determines that an arc fault has been generated, when the count of the high signals is equal to or larger than the predetermined reference number.

7. The arc fault detector according to claim 6, wherein when the controller counts the high signals for the predetermined time period, the controller compares intervals between the high signals with a predetermined reference interval and counts only high signals having intervals equal to or higher than the predetermined reference interval.

8. The arc fault detector according to claim 1, wherein the reference arc fault signal has information about at least one of a width, count, and interval of high signals.

9. The arc fault detector of claim 1, wherein in determining whether all of comparison signals received from the plurality of comparators are identical to the reference arc fault signals, it is determined whether the comparison signals are substantially similar to the reference arc fault signals.

10. An electrical device comprising:
    a noise filter connected to external power, to filter noise in the external power; and
    an arc fault detector to detect current flowing through a plurality of loads, output a comparison signal by comparing a voltage corresponding to a filtered frequency with a predetermined threshold voltage, determine whether an arc fault has been generated by comparing the comparison signal with a predetermined reference arc fault signal, and control selective cut-off of power to the plurality of loads, when it is determined that an arc fault has been generated,
    wherein the arc fault detector includes a plurality of High Pass Filters (HPFs) that are connected to a current detector and have different cut-off frequencies, a plurality of comparators that are connected to the plurality of HPFs and have different threshold voltages,
    wherein when all of comparison signals received from the plurality of comparators are identical to reference arc fault signals, the arc fault detector determines that parallel arc faults have been generated and controls cut-off of power to the plurality of loads.

11. The electrical device of claim 10, wherein the arc fault detector filters a frequency equal to or higher than a predetermined cut-off frequency from the frequency of the detected current.

12. The electrical device according to claim 10, wherein the arc fault detector stores information about consumption currents of the plurality of loads and information about cut-off frequencies corresponding to the consumption currents.

13. The electrical device according to claim 12, wherein the arc fault detector further comprises a controller to determine a load having a consumption current corresponding to a cut-off frequency of an HPF connected to at least one of the plurality of comparators and control cut-off of power to the determined load, when it is determined that a comparison signal received from the at least one comparator is identical to a reference arc fault signal.

14. The electrical device according to claim 10, further comprising a main switch to cut power to the plurality of loads.

15. A method of controlling an electrical device, the method comprising:
    comparing a comparison signal with a predetermined reference arc fault signal, when the comparison signal is output from at least one of a plurality of comparators corresponding to frequency bands;
    determining a cut-off frequency of the comparator that outputs the comparison signal, when it is determined that the comparison signal is identical to the reference arc fault signal;
    determining a load having a consumption current corresponding to the determined cut-off frequency based on information about consumption currents about a predetermined plurality of loads; and
    cutting power to the determined load,
    wherein the output of the comparison signal from the at least one comparator comprises:
    detecting current flowing through the plurality of loads and applying the detected current to a plurality of High Pass Filters (HPFs) having different cut-off frequencies;
    comparing a voltage corresponding to current having a frequency equal to or a predetermined cut-off frequency with a predetermined threshold, when the current is output from at least one of the plurality of HPFs; and
    outputting a comparison signal based on a comparison result,
    further comprising, when all of comparison signals output from the plurality of comparators are identical to reference arc fault signals, determining that parallel arc faults have been generated and controlling turn-off of a main switch in the electrical device.

16. The method of claim 15, further comprising displaying information indicating the arc fault of the load.

17. The method according to claim 15, wherein different threshold voltages are predetermined for the comparators connected to the plurality of HPFs.

18. The method according to claim 15, wherein reference arc fault signals having different characteristics are predetermined for cut-off frequencies of the plurality of HPFs.

19. The method according to claim 15, further comprising:
    determining cut-off frequencies of at least two comparators, if it is determined that comparison signals output from the at least two comparators are identical to reference arc fault signals;
    determining loads having consumption currents corresponding to the determined cut-off frequencies based on information about consumption currents of the plurality of loads; and
    determining a load having the arc fault by sequentially turning on the determined loads in descending order of consumption currents.

20. The method according to claim 15, further comprising:
    determining whether a plurality of loads have consumption currents corresponding to the determined cut-off frequency; and
    determining a load in which the reference arc fault signal is generated by sequentially turning on the plurality loads, if it is determined that the plurality of loads have the consumption currents corresponding to the determined cut-off frequency.

21. The method according to claim 15, further comprising:
    checking driving safety of the determined load; and
    controlling cut-off of power to the plurality of loads, when it is determined based on the driving safety of the determined load that when the determined load is deactivated, function execution is impossible in the electrical device.

22. The method according to claim 15, wherein the comparison of the comparison signal with the predetermined reference arc fault signal comprises:
    counting high signals of the comparison signal for a predetermined reference time;
    comparing the count with a predetermined reference number; and
    determining that an arc fault has been generated, when the count is equal to or higher than the reference number.

23. The method according to claim 22, wherein the counting of the high signals for the predetermined reference time comprises:
    comparing intervals between the high signals with a predetermined reference interval; and
    counting only high signals having intervals equal to or higher than the reference interval.

24. A system to detect an arc fault, comprising:
    an AC power source to commonly provide power to a plurality of electrical devices;
    each electrical device of the plurality of electrical devices comprising:
    a noise filter to filter noise included in a common AC power signal; and
    an arc fault detector to determine whether the arc fault has been generated in at least one load connected to the output of the arc fault detector,
    wherein the arc fault detector includes a plurality of High Pass Filters (HPFs) that are connected to a current detector and have different cut-off frequencies, a plurality of comparators that are connected to the plurality of HPFs and have different threshold voltages,
    wherein when all of comparison signals received from the plurality of comparators are identical to reference arc fault signals, the arc fault detector determines that parallel arc faults have been generated and controls cut-off of power to a plurality of loads.

25. The system of claim 24, wherein the noise filter prevents external noise from being induced into the arc fault detector and disturbing arc fault detection.

* * * * *